(12) United States Patent
Joo et al.

(10) Patent No.: US 12,262,546 B2
(45) Date of Patent: Mar. 25, 2025

(54) SEMICONDUCTOR DEVICE AND THREE-PHASE INVERTER COMPRISING THE SAME

(71) Applicants: HYUNDAI MOTOR COMPANY, Seoul (KR); KIA CORPORATION, Seoul (KR)

(72) Inventors: NackYong Joo, Suwon-si (KR); Dae Hwan Chun, Suwon-si (KR); Jungyeop Hong, Seoul (KR); Youngkyun Jung, Seoul (KR); Junghee Park, Suwon-si (KR)

(73) Assignees: HYUNDAI MOTOR COMPANY, Seoul (KR); KIA CORPORATION, Seoul (KR)

(*) Notice: Subject to any disclaimer, the term of this patent is extended or adjusted under 35 U.S.C. 154(b) by 417 days.

(21) Appl. No.: 17/835,367

(22) Filed: Jun. 8, 2022

(65) Prior Publication Data
US 2023/0246095 A1    Aug. 3, 2023

(30) Foreign Application Priority Data
Feb. 3, 2022    (KR) .................. 10-2022-0014113

(51) Int. Cl.
*H10D 12/00*    (2025.01)
*H02M 1/088*    (2006.01)
*H02M 7/537*    (2006.01)
*H10D 62/17*    (2025.01)
*H10D 64/23*    (2025.01)

(52) U.S. Cl.
CPC .......... *H10D 12/481* (2025.01); *H02M 1/088* (2013.01); *H02M 7/537* (2013.01); *H10D 62/393* (2025.01); *H10D 64/231* (2025.01)

(58) Field of Classification Search
CPC .... H10D 12/00; H10D 12/031; H10D 12/035; H10D 12/038; H10D 12/421; H10D 12/441; H10D 12/461; H10D 12/481; H10D 64/231; H10D 62/393; H02M 1/088; H02M 7/537
See application file for complete search history.

(56) References Cited

U.S. PATENT DOCUMENTS

2019/0333827 A1* 10/2019 Aoki .................. G01R 31/2608
2021/0159315 A1* 5/2021 Okamoto ............. H10D 12/031

* cited by examiner

*Primary Examiner* — Brook Kebede
(74) *Attorney, Agent, or Firm* — MCDONNELL BOEHNEN HULBERT & BERGHOFF LLP

(57) ABSTRACT

Provided is a semiconductor device including a semiconductor substrate, a plurality of gate electrodes disposed on the upper surface portion of the semiconductor substrate and spaced apart from each other, a plurality of emitter electrodes disposed to be overlapped with each of the plurality of gate electrodes, and a collector electrode disposed on the lower surface of the semiconductor substrate.

13 Claims, 9 Drawing Sheets

SEMICONDUCTOR DEVICE AND THREE-PHASE INVERTER COMPRISING THE SAME

CROSS REFERENCE TO RELATED APPLICATIONS

This application claims priority to and the benefit of Korean Patent Application No. 10-2022-0014113 filed in the Korean Intellectual Property Office on Feb. 3, 2022, the entire contents of which are incorporated herein by reference.

BACKGROUND

Field

The present disclosure relates to a semiconductor device, and more particularly, to an insulated gate bipolar transistor (IGBT) and a 3-phase inverter including the same.

Description of the Related Art

Semiconductor devices (MOSFETs, JFETs, MESFETs, IGBTs, etc.) are three-terminal devices capable of conducting current through a control of the gate terminal. In particular, power semiconductor transistors for switching require high voltage and large current.

The semiconductor devices have different electrical characteristics depending on a structure and are appropriately used depending on an application field. However, the semiconductor devices commonly require high current density, a low turn-on voltage, a high breakdown voltage, a low leakage current, and a fast switch speed, and in order to simultaneously satisfy these requirements, various structures have been proposed. However, since these above electrical characteristics have a trade-off relationship one another, studies on weakening the trade-off relationship to provide structures for improving at least one characteristic as well as maintaining the other characteristics are continuously performed.

In particular, the insulated gate bipolar transistor (IGBT) mainly used in the 3-phase inverter uses a conductivity modulation effect through high level injection of minority carriers to reduce resistance of an N-type epi region, a high resistance region. However, there is a problem of decreasing a switching speed for injecting and removing the minority carriers used for the high-level injection. Specifically, the insulated gate bipolar transistor in the 3-phase inverter repeats on/off operations to convert DC electric power into AC electric power suitable for driving a battery motor.

In addition, in order to remove a depletion layer in an off-state during the turn-on operation, hole injection time is required for the electron injection and the conductivity modulation effect, and electron removal time is required for removing holes causing the conductivity modulation effect and electrons forming the depletion layer in an on-state during the turn-off operation. Herein, in the switching operation (turn-on or turn-off), the switching speed may decrease due to the time delay for carrier movements after a voltage is applied, and a switching loss may increase according to generation of peak currents and reverse currents due to the carrier movements.

In addition, the insulated gate bipolar transistor uses the conductivity modulation phenomenon to reduce resistance in the on state and inevitably accompanies the movement of minority carriers causing the conductivity modulation phenomenon between the on/off operations. This movement of the minority carriers decreases the switching speed of the switching (turn-on or turn-off) operation and causes the switching loss.

SUMMARY

In one aspect, a semiconductor device capable of, in the switching (turn-on or turn-off) operation, reducing a time delay for carrier movement after voltage is applied to improve a switching speed, and decreasing occurrence of peak current and reverse current due to carrier movement to reduce switching loss.

Another aspect provides a 3-phase inverter including a semiconductor device.

According to one aspect, a semiconductor device includes a semiconductor substrate, a plurality of gate electrodes disposed on the upper surface portion of the semiconductor substrate and spaced apart from each other, a plurality of emitter electrodes disposed to be overlapped with each of the plurality of gate electrodes, and a collector electrode disposed on the lower surface of the semiconductor substrate.

The semiconductor device may include three gate electrodes, three emitter electrodes, and one collector electrode as one set.

The semiconductor device may include a plurality of second conductivity-type impurity regions disposed on the upper surface portion of the semiconductor substrate and connected to the plurality of emitter electrodes.

Two second conductivity-type impurity regions may be connected to one emitter electrode as one pair.

The semiconductor device may include a first conductivity-type well region disposed on the upper surface portion of the semiconductor substrate, and a plurality of second conductivity-type impurity regions may be disposed in the first conductivity-type well region.

The semiconductor device may include a plurality of first conductivity-type well regions, and a pair of second conductivity-type impurity regions may be disposed in the first conductivity-type well regions.

The semiconductor device may include a plurality of first conductivity-type well regions, and two second conductivity-type impurity regions respectively connected to adjacent emitter electrodes may be disposed in the first conductivity-type well regions.

The semiconductor device may include a plurality of first conductivity-type well regions, and each of the second conductivity-type impurity regions may be disposed in the first conductivity-type well regions.

The semiconductor substrate may have a plurality of trenches that are opened to the upper surface, and the gate electrode may be disposed in the trenches.

The trench may divide between two second conductivity-type impurity regions connected to one emitter electrode.

The semiconductor device may further include a collector layer disposed between the semiconductor substrate and the collector electrode.

The semiconductor device may be an insulated gate bipolar transistor (IGBT).

According to another aspect, an inverter includes in a 3-phase inverter circuit for supplying 3-phase power by converting an input voltage, a first semiconductor device including three gate electrodes and three emitter electrodes, and a second semiconductor device including three gate electrodes and three emitter electrodes, wherein an input voltage is supplied between a collector electrode of the first semiconductor device and a collector electrode of the second semiconductor device, a three-phase load is connected to three contact points to which the three emitter electrodes of the first semiconductor device and the three emitter electrodes of the second semiconductor device are connected, and in each of the first semiconductor device and the second semiconductor device, the three gate electrodes are disposed on one surface of the semiconductor substrate and are spaced apart from each other, the three emitter electrodes are disposed to be overlapped with each of the three gate electrodes, and the collector electrode is disposed on the other surface of the semiconductor substrate.

In a switching operation (turn-on or turn-off), a semiconductor device according to one aspect may reduce a time delay for carrier movement after voltage is applied to improve a switching speed, and may decrease occurrence of peak current and reverse current due to carrier movement for switching loss.

In addition, since the semiconductor device can reduce a chip area compared to the conventional insulated gate bipolar transistor and can be manufactured using the conventional ion implantation process and the epitaxial process, development of a new process technology is not required.

DETAILED DESCRIPTION

Figure 1:
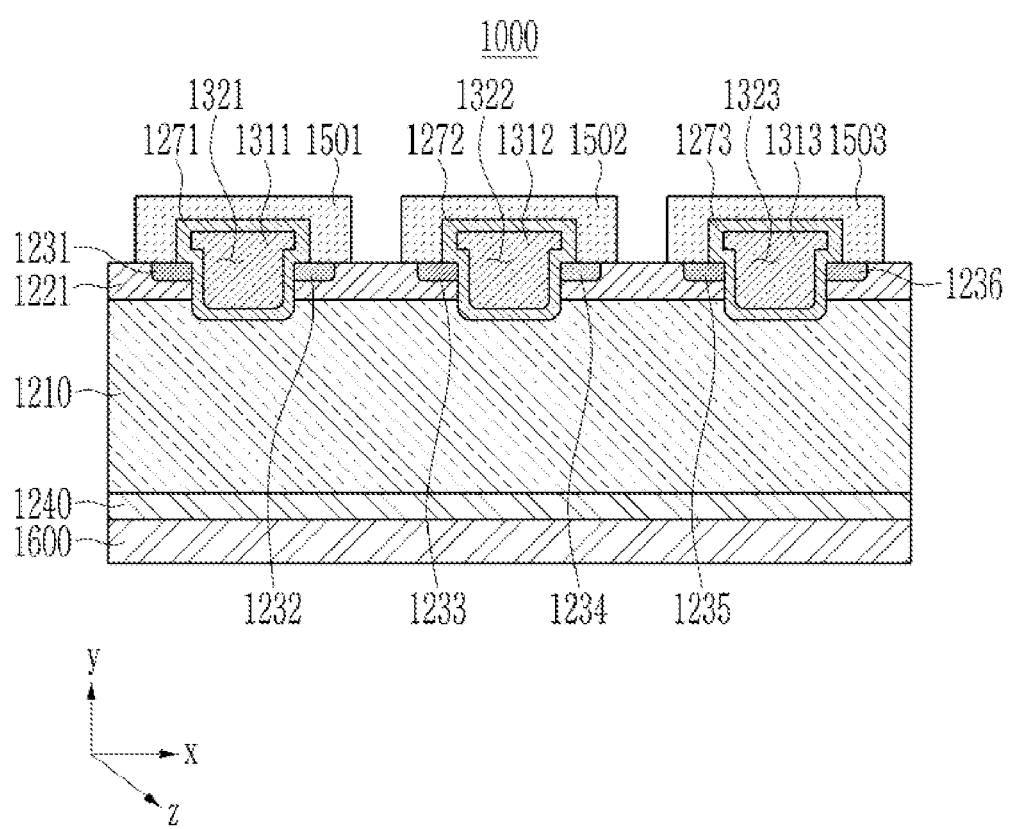
FIG. 1 is a cross-sectional view of a semiconductor device according to one aspect.

The advantages and features of the present disclosure and the methods for accomplishing the same will be apparent from the embodiments described hereinafter with reference to the accompanying drawings. However, the embodiments should not be construed as being limited to the embodiments set forth herein. Unless otherwise defined, all terms (including technical and scientific terms) used herein have the same meaning as commonly understood by one of ordinary skill in the art. The terms defined in a generally-used dictionary may not be interpreted ideally or exaggeratedly unless clearly defined. In addition, unless explicitly described to the contrary, the word "comprise," and variations such as "comprises" or "comprising," will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

FIG. 1 is a view illustrating a cross-section of a semiconductor device 1000 according to one aspect. Although FIG. 1 illustrates a case in which the semiconductor device 1000 is an insulated gate bipolar transistor (IGBT), the semiconductor device 1000 may be a field effect transistor (MOSFET) or the like.

FIG. 1 is a cross-sectional view taken in a direction substantially perpendicular to an extending direction of the gate electrodes 1311, 1312, and 1313. For example, a direction in which the gate electrodes 1311, 1312, and 1313 extend may be a Z direction, and a direction substantially perpendicular to the Z direction may be an X direction and a Y direction. Hereinafter, in the present specification, the X direction may be referred to as a width direction, the Y direction may be referred to as a height direction, and a direction opposite to the Y direction may be referred to as a depth direction. Also, in this specification, the Y direction may be referred to as an upper direction, and a direction opposite to the Y direction may be referred to as a lower direction.

The semiconductor device 1000 includes a semiconductor substrate 1210, a plurality of gate electrodes 1311, 1312, and 1313, a plurality of emitter electrodes 1501, 1502, and 1503, and a collector electrode 1600.

The semiconductor substrate 1210 may be a substrate doped with an N-type impurity at a low concentration. For example, the semiconductor substrate 1210 may be a silicon substrate.

The doping concentration of the N-type impurity in the semiconductor substrate 1210 may be, for example, about $10^{13}$ to about $10^{16}/cm^3$. Considering the doping concentration of the N-type impurity, the semiconductor substrate 1210 may be an N-type substrate.

The semiconductor substrate 1210 may have a plurality of trenches 1321, 1322, and 1323. The plurality of trenches 1321, 1322, and 1323 are opened to the upper surface of the semiconductor substrate 1210. That is, the plurality of trenches 1321, 1322, and 1323 are opened in the Y direction in FIG. 1.

The semiconductor substrate 1210 may include a first conductivity-type well region 1221 on an upper surface portion thereof. The first conductivity-type well region 1221 may be disposed on a side surface of the trench 1321 and may be divided by the trench 1321. As an example, the first conductivity-type well region 1221 may be disposed on a surface of the semiconductor substrate 1210 in the upper direction (Y direction).

The first conductivity-type well region 1221 may be a region doped with P-type impurities. A doping concentration of the P-type impurities in the first conductivity-type well region 1221 may be, for example, about $10^{15}$ to about $10^{19}/cm^3$. Considering the doping concentration of the P-type impurities, the first conductivity-type well region 1221 may be a P0 type region or a P+ type region.

Also, the semiconductor substrate 1210 may include a plurality of second conductivity-type impurity regions 1231, 1232, 1233, 1234, 1235, and 1236 on the upper surface portion. The plurality of second conductivity-type impurity regions 1231, 1232, 1233, 1234, 1235, and 1236 are disposed in the first conductivity-type well region 1221, and for example, may be surrounded by at least one side surface of the first conductivity-type well region 1221. In addition, the second conductivity-type impurity regions 1231, 1232, 1233, 1234, 1235, and 1236 may be disposed on side surfaces of the trenches 1321, 1322, and 1323 and may be divided by the trenches 1321, 1322, and 1323. For example, the plurality of second conductivity-type impurity regions 1231, 1232, 1233, 1234, 1235, and 1236 may be disposed on a surface of the first conductivity-type well region 1221 in the upper direction (Y direction). Accordingly, the semiconductor substrate 1210, the first conductivity-type well region 1221, and the second conductivity-type impurity regions 1231, 1232, 1233, 1234, 1235, and 1236 may be disposed sequentially on the side surfaces of the trench 1321, 1322, and 1323 in the upper direction (Y direction).

The second conductivity-type impurity regions 1231, 1232, 1233, 1234, 1235, and 1236 may be regions doped with N-type impurities in a high concentration, for example, an N+ type region. A doping concentration of the N-type impurities in the second conductivity-type impurity regions 1231, 1232, 1233, 1234, 1235, and 1236 may be, for example, about $10^{18}$ to about $10^{21}/cm^3$.

Optionally, the semiconductor device 1000 may further include a first conductivity-type impurity region (not shown) on the upper surface portion of the first conductivity-type well region 1221, where the second conductivity-type impurity regions 1231, 1232, 1233, 1234, 1235, and 1236 are not disposed.

For example, the first conductivity-type impurity region (not shown) may be a region doped with P-type impurities. A concentration of the P-type impurities of the first conductivity-type impurity region (not shown) may be about $10^{17}$ to about $10^{21}/cm^3$. Considering the doping concentration of the P-type impurities, the first conductivity-type impurity region may be a P+ type region.

A plurality of gate electrodes 1311, 1312, and 1313 are respectively disposed inside the plurality of trenches 1321, 1322, and 1323. The gate electrodes 1311, 1312, and 1313 may be electrically insulated from the first conductivity-type well region 1221 and the second conductivity-type impurity regions 1231, 1232, 1233, 1234, 1235, and 1236. For example, insulation layers 1271, 1272, and 1273 may be disposed inside the trenches 1321, 1322, and 1323, and gate electrodes 1311, 1312, and 1313 may be disposed on the insulation layers 1271, 1272, and 1273. That is, the insulation layers 1271, 1272, and 1273 are disposed between the trench 1321, 1322, and 1323 and the gate electrodes 1311, 1312, and 1313.

For example, the gate electrodes 1311, 1312, and 1313 may include first gate electrode regions filling the inside of the trenches 1321, 1322, and 1323 and second gate electrode regions protruding outside the trenches 1321, 1322, and 1323. Herein, the insulation layers 1271, 1272, and 1273 may be disposed on the second gate electrode regions protruding outside the trenches 1321, 1322, and 1323.

For example, the gate electrodes 1311, 1312, and 1313 may include polysilicon or metal. The insulation layers 1271, 1272, and 1273 may include $SiO_2$, $Si_3N_4$, or a combination thereof.

A plurality of emitter electrodes 1501, 1502, and 1503 are disposed on the semiconductor substrate 1210. For example, the plurality of emitter electrodes 1501, 1502, and 1503 may be disposed respectively to be overlapped with the plurality of gate electrodes 1311, 1312, and 1313. For example, the semiconductor device 1000 may include three gate electrodes 1311, 1312, and 1313 and three emitter electrodes 1501, 1502, and 1503 disposed to be overlapped with them as one set.

The plurality of second conductivity-type impurity regions 1231, 1232, 1233, 1234, 1235, and 1236 may connected to the plurality of emitter electrodes 1501, 1502, and 1503. Herein, two of the second conductivity-type impurity regions 1231, 1232, 1233, 1234, 1235, and 1236 as one pair may be connected to one emitter electrode 1501, 1502, and 1503. For example, one second conductivity-type impurity region 1231, 1232, 1233, 1234, 1235, and 1236 out of one pair of the second conductivity-type impurity regions 1231, 1232, 1233, 1234, 1235, and 1236 may be connected to one end of the lower surface of the emitter electrode 1501, 1502, and 1503, and the other one second conductivity-type impurity region 1231, 1232, 1233, 1234, 1235, and 1236 may be connected to the other end of the lower surface of the emitter electrode 1501, 1502, and 1503 with the gate electrodes 1311, 1312, and 1313 interposed therebetween. Herein, the trenches 1321, 1322, and 1323 may divide the pairs of the second conductivity-type impurity regions 1231, 1232, 1233, 1234, 1235, and 1236 therebetween.

The emitter electrodes 1501, 1502, and 1503 may be insulated from the gate electrodes 1311, 1312, and 1313 by the insulation layers 1271, 1272, and 1273, for example, insulated from the gate electrodes 1311, 1312, and 1313 by the insulation layers 1271, 1272, and 1273 on the second gate electrode regions protruding outside the trenches 1321, 1322, and 1323.

The emitter electrodes 1501, 1502, and 1503 may include Cr, Pt, Pd, Au, Ni, Ag, Cu, Al, Mo, In, Ti, polycrystalline Si, oxides thereof, nitrides thereof, or alloys thereof. In addition, the emitter electrodes 1501, 1502, and 1503 may include a multi-layer electrode structure in which different metal films are stacked, for example, Pt/Au, Pt/Al, Pd/Au, Pd/Al, or Pt/Ti/Au and Pd/Ti/Au.

The collector electrode 1600 may be positioned on the lower surface of the semiconductor substrate 1210.

For example, the semiconductor device 1000 may include one collector electrode 1600. In other words, the semiconductor device 1000 may not include a plurality of the collector electrodes 1600 to correspond to each of the plurality of emitter electrodes 1501, 1502, and 1503. For example, the semiconductor device 1000 may include three gate electrodes 1311, 1312, and 1313, three emitter electrodes 1501, 1502, and 1503, and one collector electrode 1600 as one pair.

The collector electrode 1600 may include Cr, Pt, Pd, Au, Ni, Ag, Cu, Al, Mo, In, Ti, polycrystalline Si, oxides thereof, nitrides thereof, or alloys thereof. In addition, the collector electrode 1600 may include a multi-layer electrode structure in which different metal layers are stacked, for example Ti/Au or Ti/Al.

Optionally, the semiconductor device 1000 may further include a collector 1240 positioned between the semiconductor substrate 1210 and the collector electrode 1600.

For example, the collector layer 1240 may include silicon. The collector layer 1240 may be a layer doped with P-type impurities. The P-type impurities of the collector layer 1240 may be doped at a concentration of about $10^{17}$ to about $10^{21}/cm^3$. Accordingly, the collector layer 1240 may be a P+ type layer. For example, the collector layer 1240 may have a thickness of about 0 µm to about 5 µm.

Figure 2:
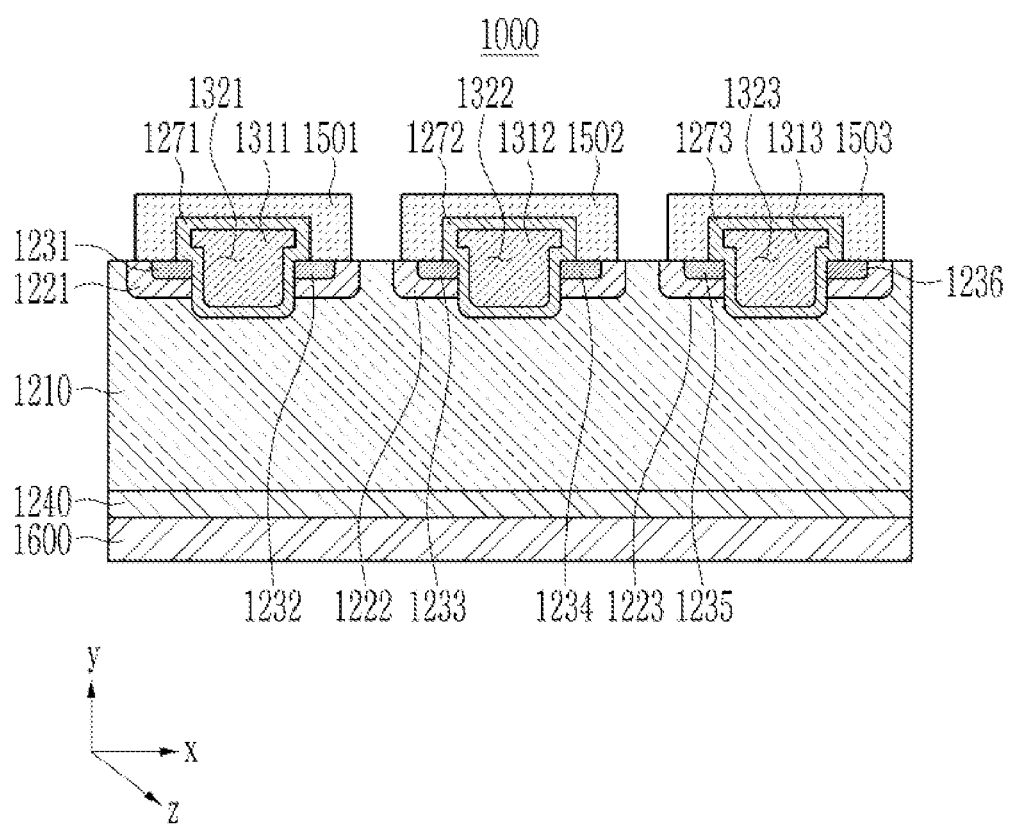
FIG. 2 is a cross-sectional view of a semiconductor device according to another aspect.

FIG. 2 is a cross-sectional view of the semiconductor device 1000 according to another aspect.

Since the semiconductor device 1000 according to this aspect is similar to the above-described semiconductor device 1000, the overlapping description will be omitted, but differences thereof will be mainly described.

FIG. 1 illustrates that the plurality of second conductivity-type impurity regions 1231, 1232, 1233, 1234, 1235, and 1236 are disposed in one first conductivity-type well region 1221.

On the other hand, in FIG. 2, the semiconductor device 1000 includes a plurality of the first conductivity-type well regions 1221, 1222, and 1223, and each one pair of the second conductivity-type impurity regions 1231, 1232, 1233, 1234, 1235, and 1236 is disposed in each one of the first conductivity-type well regions 1221, 1222, and 1223. For example, in FIG. 2, one pair of the second conductivity-type impurity regions 1231 and 1232 is connected to one emitter electrode 1501, and this one pair of the second conductivity-type impurity regions 1231 and 1232 is disposed in one first conductivity-type well region 1221. Herein, a trench 1321 may be disposed between the pair of the second conductivity-type impurity regions 1231 and 1232, and the trench 1321 may divide the first conductivity-type well region 1221.

Figure 3:
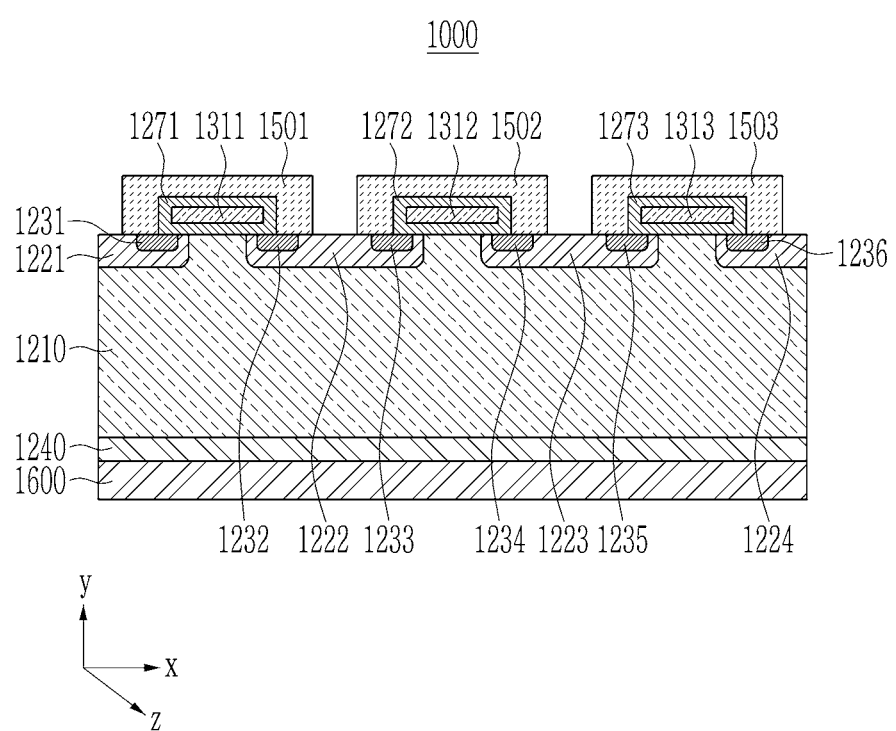
FIG. 3 is a cross-sectional view of a semiconductor device according to another aspect.

FIG. 3 is a cross-sectional view of the semiconductor device 1000 according to another aspect.

Since the semiconductor device 1000 according to this aspect is similar to the above-described semiconductor device 1000, the overlapping description will be omitted, but differences thereof will be mainly described.

In FIG. 1, the semiconductor substrate 1210 includes trenches 1321, 1322, and 1323, and the gate electrodes 1311, 1312, and 1313 are positioned inside the trenches 1321, 1322, and 1323.

On the other hand, FIG. 3 illustrates that the semiconductor substrate 1210 includes no trench, and the gate electrodes 1311, 1312, and 1313 are disposed on the semiconductor substrate 1210. Herein, the gate electrodes 1311, 1312, and 1313 may be disposed to be overlapped with the first conductivity-type well regions 1221, 1222, 1223, and 1224 and/or one pair of the second conductivity-type impurity regions 1231, 1232, 1233, 1234, 1235, and 1236.

In addition, FIG. 1 illustrates that the plurality of second conductivity-type impurity regions 1231, 1232, 1233, 1234, 1235, and 1236 are disposed in one first conductivity-type well region 1221.

On the other hand, in FIG. 3, the semiconductor device 1000 includes the plurality of first conductivity-type well regions 1221, 1222, 1223, and 1224, and two second conductivity-type impurity regions 1231, 1232, 1233, 1234, 1235, and 1236 respectively connected to the emitter electrodes 1501, 1502, and 1503 adjacently disposed inside one first conductivity-type well region 1221, 1222, 1223, and 1224. For example, in FIG. 3, two second conductivity-type impurity regions 1232 and 1233 are respectively connected to the adjacent first and second emitter electrodes 1501 and 1502, and these two second conductivity-type impurity regions 1232 and 1233 are disposed within one first conductivity-type well region 1222.

Figure 4:
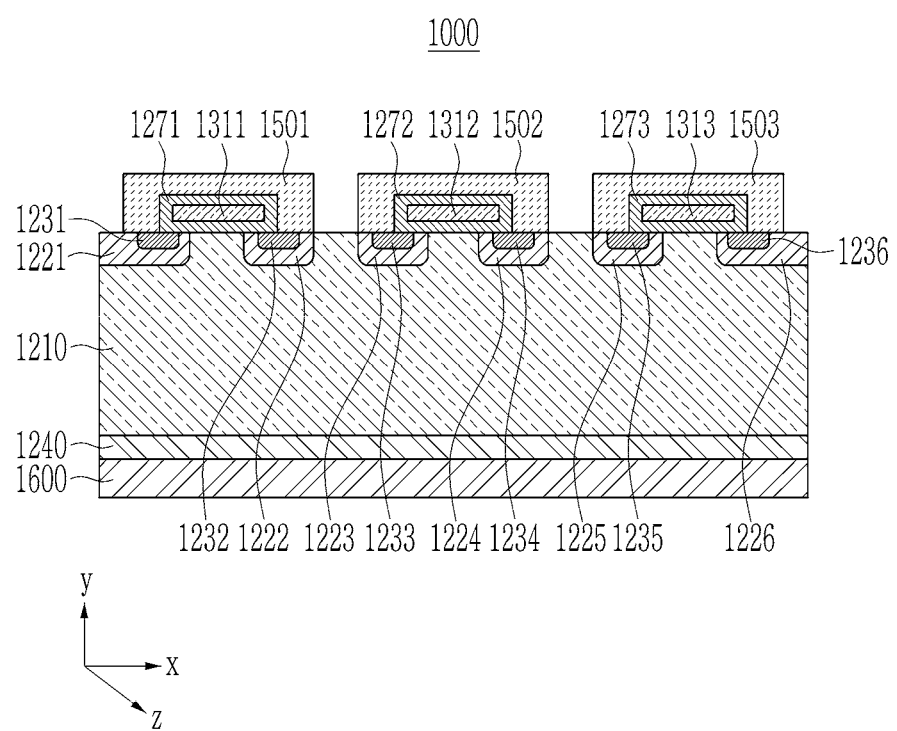
FIG. 4 is a cross-sectional view of a semiconductor device according to another aspect.

FIG. 4 is a cross-sectional view of the semiconductor device 1000 according to another aspect.

Since the semiconductor device 1000 according to this aspect is similar to the above-described semiconductor device 1000, the overlapping description will not be repeated, but differences thereof will be mainly described.

In FIG. 3, two second conductivity-type impurity regions 1231, 1232, 1233, 1234, 1235, and 1236 respectively connected to the emitter electrodes 1501, 1502, and 1503 adjacent to each other are disposed in one first conductivity-type well region 1221, 1222, 1223, and 1224.

On the other hand, in FIG. 4, the semiconductor device 1000 includes the plurality of the first conductivity-type well regions 1221, 1222, 1223, 1224, 1225, and 1226, and the plurality of the second conductivity-type impurity regions 1231, 1232, 1233, 1234, 1235, and 1236 are respectively disposed within the plurality of first conductivity-type well regions 1221, 1222, 1223, 1224, 1225, 1226. For example, in FIG. 4, one second conductivity-type impurity region 1232 is positioned within one first conductivity-type well region 1222.

Figure 5:
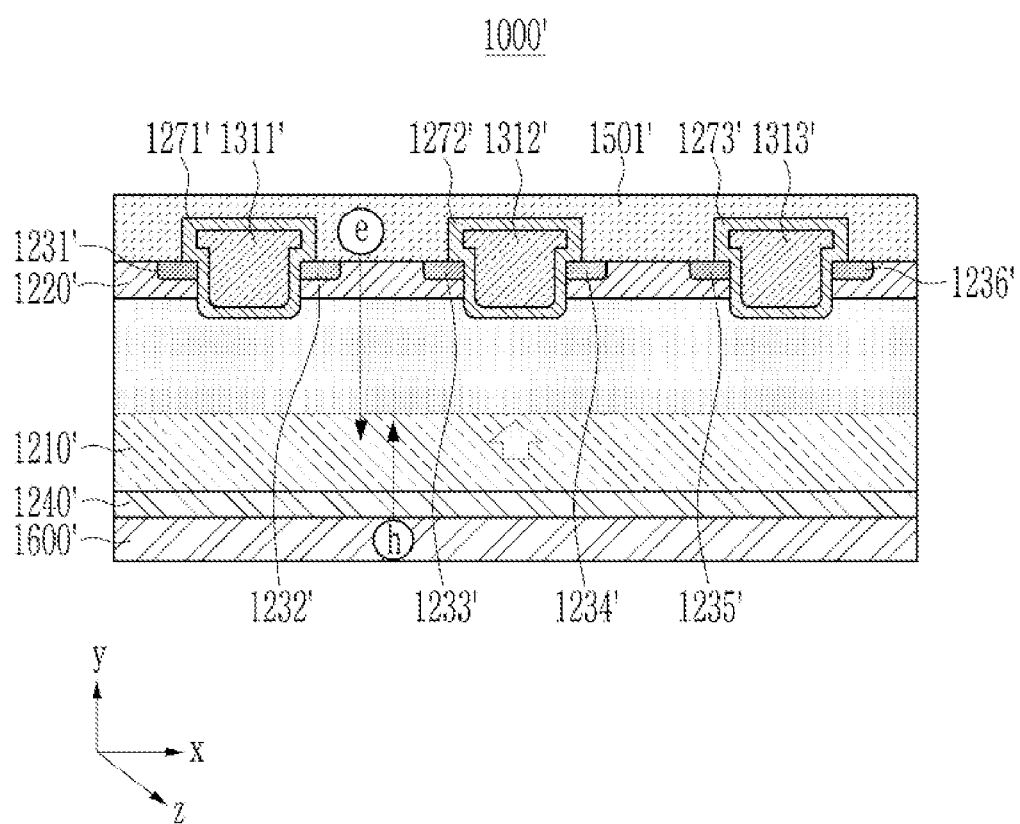
FIG. 5 is a cross-sectional view illustrating carrier movement and a change in a depletion layer in a turn-on state of a semiconductor device according to the prior art.
Figure 6:
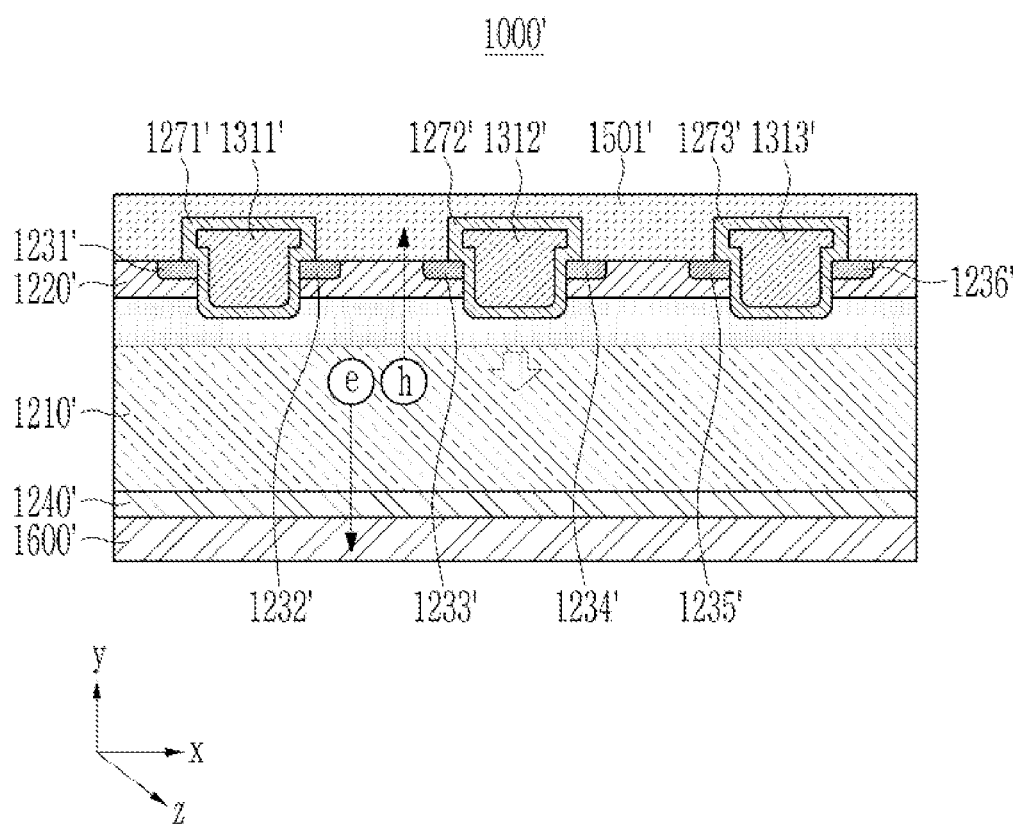
FIG. 6 is a cross-sectional view illustrating carrier movement and a change in a depletion layer in a turn-off state of a semiconductor device according to the related art.
Figure 7:
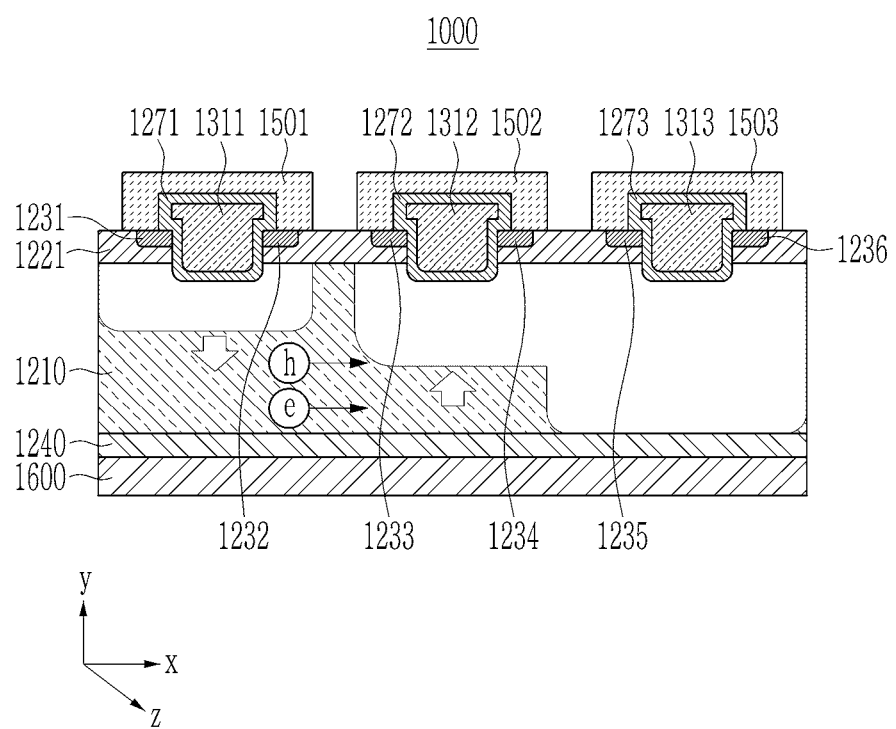
FIG. 7 is a cross-sectional view illustrating carrier movement and a change in a depletion layer in a switched (turn-on or turn-off) state of a semiconductor device according to one aspect.

FIG. 5 is a cross-sectional view illustrating carrier movement and a change in a depletion layer in a turn-on state of a semiconductor device 1000' according to the prior art, and FIG. 6 is a cross-sectional view illustrating carrier movement and a change in a depletion layer in a turn-off state of a semiconductor device 1000' according to the related art. FIG. 7 is a cross-sectional view illustrating carrier movement and a change in a depletion layer in a switched (turn-on or turn-off) state of a semiconductor device 1000 according to one aspect.

Referring to FIGS. 5 and 6, the semiconductor device 1000' according to the prior art includes no plurality of emitter electrodes but one emitter electrode 1501' alone corresponding to a collector electrode 1600'.

Herein, when a voltage applied to gate electrodes 1311', 1312', and 1313' is reduced below a threshold voltage during the turn-off operation, holes (h) causing the conductivity modulation phenomenon are removed to a (−) voltage direction of an emitter electrode 1501', while electrons (e) conducting a current are removed to a (+) voltage direction of the collector electrode 1600', forming a depletion layer. Accordingly, carriers escape through the emitter electrode 1501' and the collector electrode 1600' to release excess carriers formed in a semiconductor substrate 1210', and movement of these departing carriers acts as a delayed current outside the semiconductor device 1000', causing a current tail phenomenon.

In addition, during the turn-on operation, when a voltage applied to the gate electrodes 1311', 1312', and 1313' increases up to a threshold voltage or higher, electrons are injected from the emitter electrode 1501' through a channel and remove the depletion layer, and holes are injected from a collector layer 1240' of the collector electrode 1600' and cause the conductivity modulation phenomenon. Accordingly, the carriers are injected through the emitter electrode 1501' and the collector electrode 1600' to form the excess carriers in semiconductor substrate 1210', and the injected carriers act as an additional current outside the semiconductor device 1000', generating the current peak phenomenon.

On the other hand, referring to FIG. 7, in the semiconductor device 1000 according to one aspect, the turn-on and turn-off operations may be simultaneously operated. For example, the first gate electrode 1501 is supplied with an off-level voltage for the turn-off operation of the first gate electrode 1501 region, and simultaneously, the second gate electrode 1502 is supplied with an on-level level voltage for the turn-on operation of the second gate electrode 1502 region. Then, carriers (holes and electrons) may be transferred from the first gate electrode 1501 region where turned off to the second gate electrode 1502 region where turned on. Accordingly, excess carriers present in the turned-off gate electrode region move to the turned-on gate electrode region, blocking a carrier flow to the outside of the semiconductor device 1000. In other words, due to the carrier movement between the turned-on gate electrode region and the turned-off gate electrode region in the semiconductor device 1000, there is no additional current outside the semiconductor device 1000, not generating the current peak and the current tail phenomenon.

Figure 8:
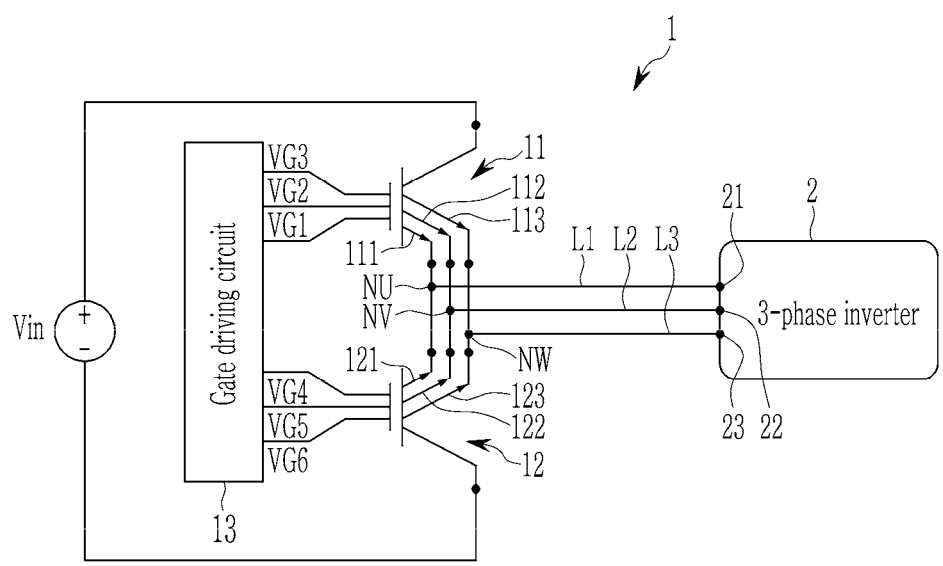
FIG. 8 is a circuit diagram illustrating a three-phase inverter using a semiconductor device according to an example embodiment.

FIG. 8 is a circuit diagram illustrating a three-phase inverter using a semiconductor device according to an example embodiment.

As shown in FIG. 8, the 3-phase inverter 1 converts an input voltage Vin to supply Vin to 3-phase AC electric power suitable for a 3-phase motor 2. The 3-phase inverter 1 includes two semiconductor devices 11 and 12 having the same structure as the semiconductor devices 1000. The 3-phase inverter 1 may further include a gate driving circuit 13 that generates a plurality of gate voltages VG1 to VG6 for controlling switching operations of the two semiconductor devices 11 and 12.

Three gate electrodes of the semiconductor device 11 are supplied with three gate voltages VG1, VG2, and VG3. In the semiconductor device 11, a current may flow according to three gate voltages VG1, VG2, and VG3 through three emitter electrodes 111, 112, and 113 corresponding to the three gate electrode regions.

The three gate electrodes of the semiconductor device 12 may be supplied with three gate voltages VG4, VG5, and VG6. In the semiconductor device 12, a current may flow according to the three gate voltages VG4, VG5, and VG6 through three emitter electrodes 121, 122, and 123 corresponding to the three gate electrode regions.

The three emitter electrodes 111, 112, and 113 of the semiconductor device 11 are connected at three contact points NU, NV, and NW to the three emitter electrodes 121, 122, and 123 of the semiconductor device 12. Between collector electrode of the semiconductor device 11 and collector electrode of the semiconductor device 12, the input voltage Vin is supplied.

The three contact points NU, NV, and NW are connected to three terminals 21, 22, and 23 of the three-phased motor 2 through three wires L1, L2, and L3.

Figure 9:
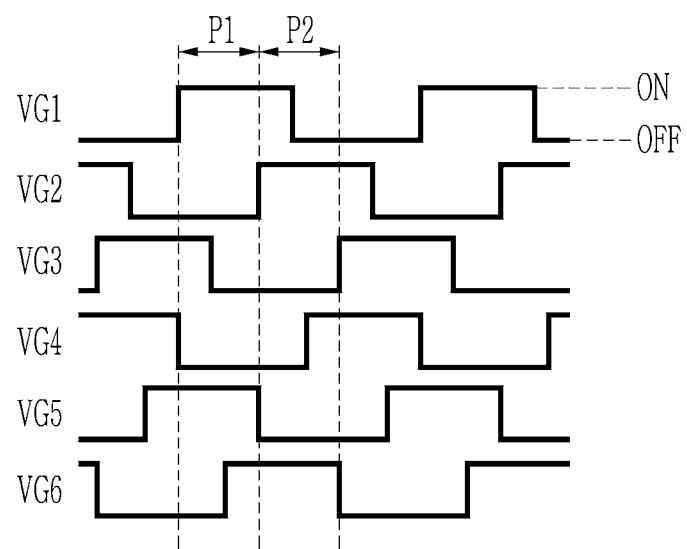
FIG. 9 is a waveform diagram illustrating waveforms of a plurality of gate voltages according to an example embodiment.

FIG. 9 is a waveform diagram illustrating waveforms of a plurality of gate voltages according to an example embodiment.

The three gate voltages VG1, VG2, and VG3 are square waves having phase differences P1 and P2 of 120 degrees (°) between two adjacent gate voltages VG1/VG2 and VG2/VG3. The three gate voltages VG4, VG5, and VG6 have phases inverted from the phases of the gate voltages VG1, VG2, and VG3. In the square wave shown in FIG. 9, a low level is an off-level, and a high level is an on-level.

As shown in FIG. 9, the on-level of the gate voltage VG1 turns on the first gate electrode region of the semiconductor device 11 so that a current may flow through the emitter electrode 111. The on-level of the gate voltage VG2 turns on the second gate electrode region of the semiconductor device 11 so that a current may flow through the emitter electrode 112. The on-level of the gate voltage VG3 turns on the third gate electrode region of the semiconductor device 11 so that a current may flow through the emitter electrode 113.

The on-level of the gate voltage VG4 turns on the fourth gate electrode region of the semiconductor device 12 so that a current may flow through the emitter electrode 121. The on-level of the gate voltage VG5 turns on the fifth gate electrode region of the semiconductor device 12 so that a current may flow through the emitter electrode 122. The on-level of the gate voltage VG6 turn on the sixth gate electrode region of the semiconductor device 12 so that a current may flow through the emitter electrode 123.

According to a plurality of the gate voltages VG1 to VG6 shown in FIG. 9, the 3-phase motor 2 connected to the three contact points NU, NV, and NW may be supplied with 3-phase electric power.

While this disclosure has been described in connection with what is presently considered to be practical example embodiments, it is to be understood that the disclosure is not limited to the disclosed embodiments. On the contrary, it is intended to cover various modifications and equivalent arrangements included within the spirit and scope of the appended claims.

The invention claimed is:

1. A semiconductor device, comprising:
a semiconductor substrate;
a plurality of gate electrodes positioned on an upper surface portion of the semiconductor substrate and spaced apart from each other;
a plurality of emitter electrodes positioned overlapping with each of the plurality of gate electrodes; and
a collector electrode positioned on a lower surface of the semiconductor substrate.

2. The semiconductor device of claim 1, wherein the semiconductor device includes three gate electrodes, three emitter electrodes, and one collector electrode as one set.

3. The semiconductor device of claim 1, wherein the semiconductor device is positioned on the upper surface portion of the semiconductor substrate and includes a plurality of second conductivity-type impurity regions connected to the plurality of emitter electrodes.

4. The semiconductor device of claim 3, wherein two second conductivity-type impurity regions are connected to one emitter electrode.

5. The semiconductor device of claim 3, further comprising a first conductivity-type well region disposed on the upper surface portion of the semiconductor substrate; and
the plurality of second conductivity-type impurity regions are positioned in the first conductivity-type well region.

6. The semiconductor device of claim 4, further comprising a plurality of first conductivity-type well regions; and
the pair of second conductivity-type impurity regions are positioned in the first conductivity-type well regions.

7. The semiconductor device of claim 4, further comprising a plurality of first conductivity-type well regions; and
two second conductivity-type impurity regions connected to adjacent emitter electrodes positioned in the first conductivity-type well region.

8. The semiconductor device of claim 3, further comprising a plurality of first conductivity-type well regions, wherein each of the second conductivity-type impurity regions is positioned in each of the first conductivity-type well regions.

9. The semiconductor device of claim 1, further comprising a plurality of trenches that are opened to the upper surface, wherein each of the plurality of gate electrodes is positioned in each of the plurality of trenches.

10. The semiconductor device of claim 9, wherein the each of the plurality of trench divides two second conductivity-type impurity regions connected to one emitter electrode.

11. The semiconductor device of claim 1, further comprising a collector layer positioned between the semiconductor substrate and the collector electrode.

12. The semiconductor device of claim 1, wherein the semiconductor device is an insulated gate bipolar transistor (IGBT).

13. An inverter comprising:
in a 3-phase inverter circuit for supplying 3-phase power by converting an input voltage,
a first semiconductor device including three gate electrodes and three emitter electrodes; and
a second semiconductor device including three gate electrodes and three emitter electrodes;
an input voltage supplied between a collector electrode of the first semiconductor device and a collector electrode of the second semiconductor device, and a three-phase load connected to three contact points to which the three emitter electrodes of the first semiconductor device and the three emitter electrodes of the second semiconductor device are connected; and
in each of the first semiconductor device and the second semiconductor device,
the three gate electrodes are positioned on one surface of the semiconductor substrate and are spaced apart from each other, the three emitter electrodes are positioned to be overlapping with each of the three gate electrodes, and the collector electrode is positioned on an other surface of the semiconductor substrate.

\* \* \* \* \*